United States Patent
Murakami

(10) Patent No.: US 8,749,078 B2
(45) Date of Patent: Jun. 10, 2014

(54) SEMICONDUCTOR DEVICE

(75) Inventor: Sadatoshi Murakami, Mie-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/601,066

(22) Filed: Aug. 31, 2012

(65) Prior Publication Data

US 2013/0234299 A1 Sep. 12, 2013

(30) Foreign Application Priority Data

Mar. 7, 2012 (JP) ................. 2012-051034

(51) Int. Cl.
*H01L 23/544* (2006.01)

(52) U.S. Cl.
USPC ........................................ 257/797

(58) Field of Classification Search
CPC ............ H01L 23/544; H01L 2223/544; H01L 2223/54453
USPC .................. 257/797, 773, 693, 632
See application file for complete search history.

(56) References Cited

U.S. PATENT DOCUMENTS

| | | | | |
|---|---|---|---|---|
| 5,567,643 A | * | 10/1996 | Lee et al. | 438/601 |
| 7,161,231 B2 | * | 1/2007 | Koike | 257/620 |
| 2007/0257371 A1 | * | 11/2007 | Wakayama et al. | 257/758 |
| 2010/0207195 A1 | | 8/2010 | Fukuzumi et al. | |
| 2011/0031547 A1 | | 2/2011 | Watanabe | |
| 2011/0115014 A1 | | 5/2011 | Ichinose et al. | |
| 2012/0068253 A1 | | 3/2012 | Oota et al. | |

FOREIGN PATENT DOCUMENTS

| | | |
|---|---|---|
| JP | 2009-146954 | 7/2009 |
| JP | 2011-199131 | 10/2011 |

* cited by examiner

*Primary Examiner* — Nikolay Yushin
(74) *Attorney, Agent, or Firm* — Oblon, Spivak, McClelland, Maier & Neustadt, L.L.P.

(57) ABSTRACT

According to one embodiment, a semiconductor device includes a stacked body in which a plurality of conductive layers and a plurality of insulating layers are alternately stacked. The semiconductor device includes a mark and a supporting unit. The mark is opened onto a surface of the stacked body. The supporting unit is provided around the mark. The supporting unit extends in a stacked direction of the stacked body. The supporting unit is in contact with at least a plurality of conductive layers.

11 Claims, 14 Drawing Sheets

SEMICONDUCTOR DEVICE

CROSS-REFERENCE TO RELATED APPLICATIONS

This application is based upon and claims the benefit of priority from the prior Japanese Patent Application No. 2012-051034, filed on Mar. 7, 2012, the entire contents of which are incorporated herein by reference.

FIELD

Embodiments described herein relate generally to a semiconductor device and a method for manufacturing the same.

BACKGROUND

There is a semiconductor device having a stacked body in which a plurality of conductive layers and a plurality of insulating layers are alternately stacked.

As a semiconductor device having such a stacked body, for example, there is a three-dimensional stacked memory.

In a method of manufacturing a three-dimensional stacked memory, it is required to form a through hole that passes through a stacked body in a stacked direction. However, it is difficult to form a through hole by etching because a plurality of conductive layers and a plurality of insulating layers are alternately stacked. Therefore, a substitution process that forms an insulating layer in a portion where sacrificial layers are removed through a through hole after alternately stacking a plurality of conductive layers and a plurality of sacrificial layers, forming a through hole that passes through the stacked body in the stacked direction, and removing the sacrificial layer through the through hole is used.

Here, a lithographic mark such as an alignment mark or an inspection mark (an alignment measurement mark) is provided in the stacked body. Further, a mark for inspecting a photo mask may be transferred onto the stacked body.

In this case, if the sacrificial layers are removed by the substitution process, the conductive layers are not supported in a portion where such a mark is provided but the stacked conductive layers may be undesirably partially collapsed.

DETAILED DESCRIPTION

Figure 1:
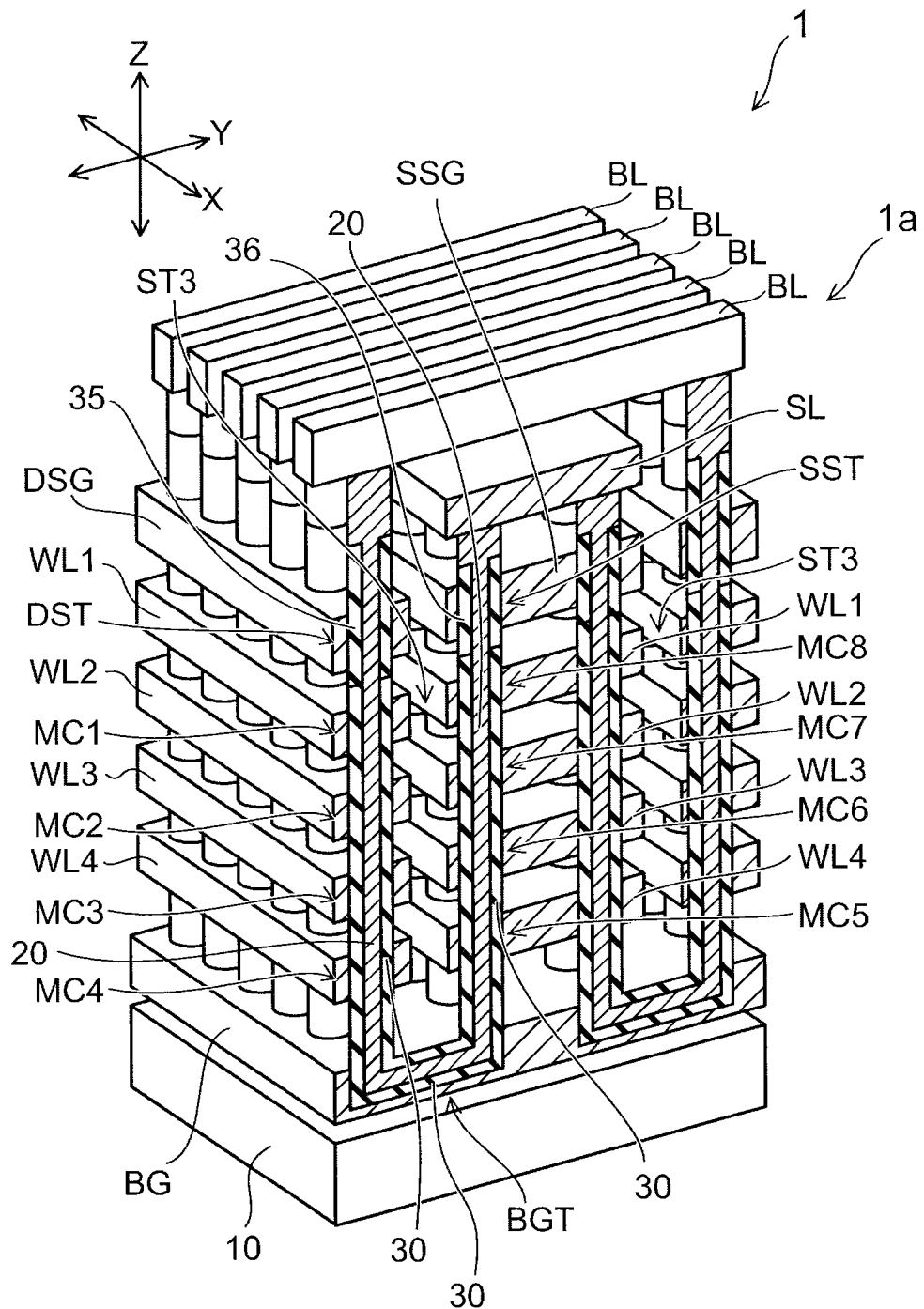
FIG. 1 is a schematic perspective view for illustrating a configuration of the element region 1$a$ of the semiconductor device 1 according to the first embodiment.

In general, according to one embodiment, a semiconductor device includes a stacked body in which a plurality of conductive layers and a plurality of insulating layers are alternately stacked. The semiconductor device includes a mark and a supporting unit. The mark is opened onto a surface of the stacked body. The supporting unit is provided around the mark. The supporting unit extends in a stacked direction of the stacked body. The supporting unit is in contact with at least a plurality of conductive layers.

Hereinafter, with reference to drawings, embodiments will be illustrated. In the drawings, like components are denoted by like reference numerals and detailed description thereof will be appropriately omitted.

Hereinafter, for the sake of description, an XYZ orthogonal coordinate system is introduced. In the coordinate system, two directions which are parallel to a main surface of a substrate 10 and orthogonal to each other are referred to as an X-direction and a Y-direction and a direction which is orthogonal to both the X-direction and the Y-direction is referred to as a Z-direction.

Further, in the following embodiments, silicon is illustrated as an example of the semiconductor, but a semiconductor other than silicon may be used.

[First Embodiment]

First, a semiconductor device 1 according to a first embodiment will be illustrated.

In the semiconductor device 1, a contact region where a contact electrode for connecting a conductive layer and an upper layer interconnect is provided, a peripheral circuit region in which a peripheral circuit for driving semiconductor elements (memory cells) provided in an element region 1$a$ is provided and the upper layer interconnect are provided. However, since a known technology may be applied thereto, the description thereof will be omitted.

Here, a configuration of the element region 1$a$ where the semiconductor elements are provided will be illustrated.

FIG. 1 is a schematic perspective view for illustrating a configuration of the element region 1$a$ of the semiconductor device 1 according to the first embodiment.

FIG. 1 illustrates the configuration of the memory cell array provided in the element region 1$a$ as an example.

Further, in FIG. 1, in order to simplify the drawing, an insulated part other than an insulating film formed in the memory hole is omitted.

As illustrated in FIG. 1, a back gate BG is provided on a substrate 10 through an insulating layer which is not illustrated. The back gate BG is, for example, a conductive silicon layer to which an impurity is added. On the back gate BG, a plurality of conductive layers WL1 to WL4 and insulating layers which are not illustrated are alternately stacked. The number of the conductive layers WL1 to WL4 is arbitrary, and in the embodiment, for example, four conductive layers are illustrated. The conductive layers WL1 to WL4 are, for example, conductive silicon layers to which an impurity is added.

The conductive layers WL1 to WL4 are divided into a plurality of blocks by grooves ST3 extending in the X-direction. On an uppermost conductive layer WL1 in an arbitrary block, a drain side selective gate DSG is provided through an insulating layer which is not illustrated. The drain side selective gate DSG is, for example, a conductive silicon layer to which an impurity is added. On an uppermost conductive layer WL1 in another block adjacent to the arbitrary block, a source side selective gate SSG is provided through an insulating layer which is not illustrated. The source side selective gate SSG is, for example, a conductive silicon layer to which an impurity is added.

On the source side selective gate SSG, a source line SL is provided through an insulating layer which is not illustrated. The source line SL is, for example, a conductive silicon layer to which an impurity is added. Alternatively, the source line SL may use a metal material. On the source line SL and the drain side selective gate DSG, a plurality of bit lines BL are provided through an insulating layer which is not illustrated. The bit lines BL extend in the Y-direction.

In the above-mentioned stacked body on the substrate 10, a plurality of U-shaped memory holes are provided. In the block including the drain side selective gate DSG, a memory hole that passes through the drain side selective gate DSG and the conductive layers WL1 to WL4 disposed below the drain side selective gate DSG and extends in the Z-direction is formed. In the block including the source side selective gate SSG, a memory hole that passes through the source side selective gate SSG and the conductive layers WL1 to WL4 disposed below the source side selective gate SSG and extends in the Z-direction is formed. Both the memory holes are connected by a memory hole that is formed in the back gate BG and extends in the Y-direction.

Inside the memory hole, a silicon body 20 is provided as a U-shaped semiconductor layer. On an inner wall of the memory hole between the drain side selective gate DSG and the silicon body 20, a gate insulating film 35 is formed. On an inner wall of the memory hole between the source side selective gate SSG and the silicon body 20, a gate insulating film 36 is formed. On an inner wall of the memory hole between the conductive layers WL1 to WL4 and the silicon body 20, an insulating film 30 is formed. On an inner wall of the memory hole between the back gate BG and the silicon body 20, an insulating film 30 is formed.

The insulating film 30 and the gate insulating films 35 and 36 have, for example, an ONO (oxide-nitride-oxide) structure in which a silicon nitride film is interposed between a pair of silicon dioxide films.

Figure 2:
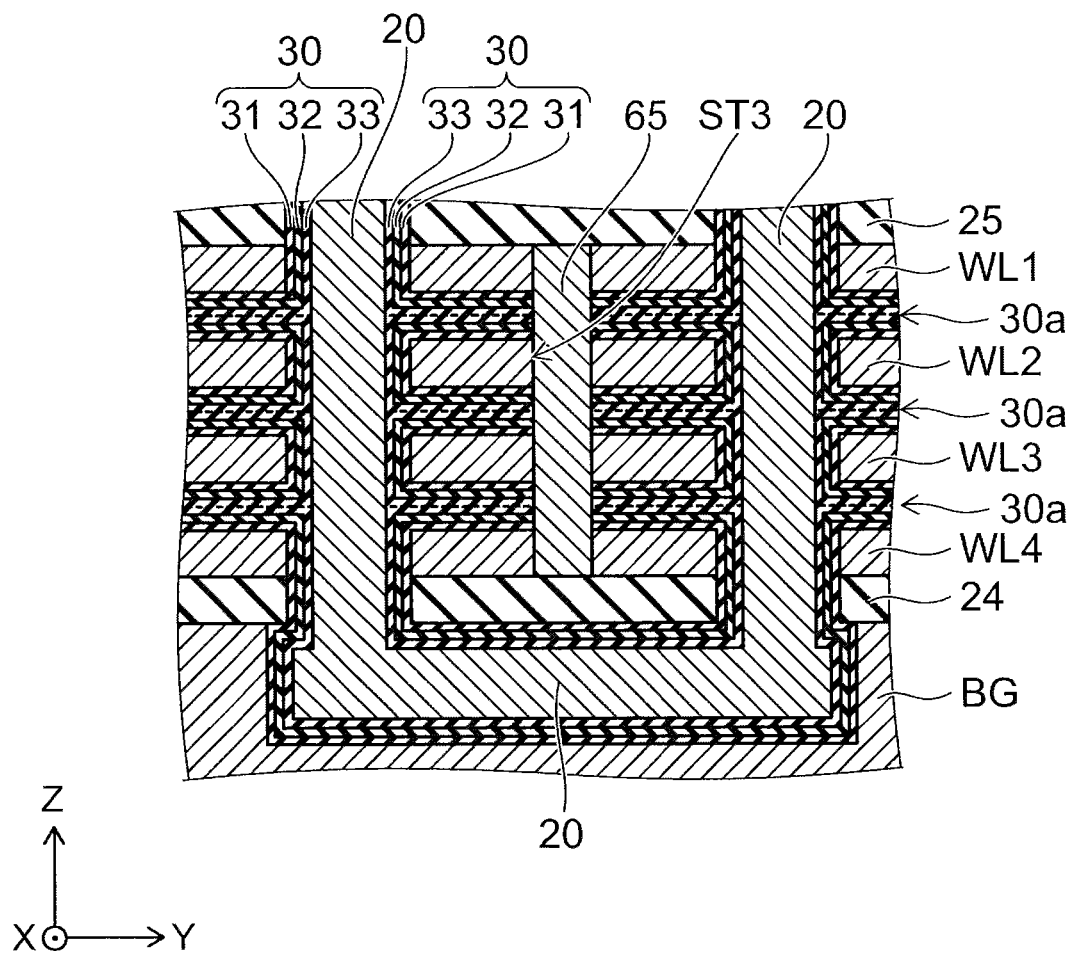
FIG. 2 is a schematic view for illustrating a cross-section of the memory cell.

FIG. 2 is a schematic view for illustrating a cross-section of the memory cell.

Further, FIG. 2 illustrates an insulating layer 24 between the back gate BG and the conductive layer WL4 which is omitted in FIG. 1. In addition, an insulating layer 25 between the conductive layer WL1 and the drain side selective gate DSG and the source side selective gate SSG is also illustrated. The insulating layers 24 and 25 are, for example, formed of a silicon dioxide film.

Between the conductive layers WL1 to WL4 and the silicon body 20, a first insulating film 31, a charge storage layer 32, and a second insulating film 33 are provided in this order from the conductive layers WL1 to WL4. The first insulating film 31 is in contact with the conductive layers WL1 to WL4, the second insulating film 33 is in contact with the silicon body 20, and the charge storage layer 32 is provided between the first insulating film 31 and the second insulating film 33.

The silicon body 20 functions as a channel, the conductive layers WL1 to WL4 function as control gates, and the charge storage layer 32 functions as a data memory layer that stores charges injected from the silicon body 20. Specifically, at intersections of the silicon body 20 and the conductive layers WL1 to WL4, memory cells having a structure where the control gate encloses the channel are formed.

The semiconductor device 1 is a non-volatile semiconductor memory device that may electrically and freely perform deleting and writing of data and store the stored contents even when the power is turned off. For example, the memory cell is a memory cell having a charge trap structure. The charge storage layer 32 has a plurality of traps that trap the charges (electrons), and for example, is formed of a silicon nitride film. The second insulating film 33 is, for example, formed of a silicon dioxide film. When the charges are injected from the silicon body 20 into the charge storage layer 32 or the charges stored in the charge storage layer 32 are diffused to the silicon body 20, the second insulating film 33 becomes a potential barrier. The first insulating film 31 is, for example, formed of a silicon dioxide film and prevents the charges stored in the charge storage layer 32 from being diffused to the conductive layers WL1 to WL4.

The insulating layer 30a provided between the conductive layers WL1 to WL4 is opposite to the insulating film 30 having the ONO structure and formed of two layers.

Further, inside the groove ST3 that divides the conductive layers WL1 to WL4 in the Y-direction, a supporting unit 65 is provided. The supporting unit 65 is, for example, formed of a silicon nitride film. The forming of the supporting unit 65 will be described below.

Referring to FIG. 1 again, a gate insulating film 35 is provided between the silicon body 20 that passes through the drain side selective gate DSG and the drain side selective gate DSG to configure a drain side selective transistor DST. An upper edge of the silicon body 20 that upwardly protrudes from the drain side selective gate DSG is connected to each corresponding bit line BL.

A gate insulating film 36 is provided between the silicon body 20 that passes through the source side selective gate SSG and the source side selective gate SSG to configure a source side selective transistor SST. An upper edge of the silicon body 20 that upwardly protrudes from the source side selective gate SSG is connected to a source line SL.

The back gate BG, the silicon body 20 provided in the back gate BG, and the insulating film 30 between the back gate BG and the silicon body 20 configure a back gate transistor BGT.

Between the drain side selective transistor DST and the back gate transistor BGT, a memory cell MC1 that has the conductive layer WL1 as a control gate, a memory cell MC2 that has the conductive layer WL2 as a control gate, a memory cell MC3 that has the conductive layer WL3 as a control gate, and a memory cell MC4 that has the conductive layer WL4 as a control gate are provided.

Between the back gate transistor BGT and the source side selective transistor SST, a memory cell MC5 that has the conductive layer WL4 as a control gate, a memory cell MC6 that has the conductive layer WL3 as a control gate, a memory cell MC7 that has the conductive layer WL2 as a control gate, and a memory cell MC8 that has the conductive layer WL1 as a control gate are provided.

The drain side selective transistor DST, the memory cells MC1 to MC4, the back gate transistor BGT, the memory cells MC5 to MC8, and the source side selective transistor SST are connected in series to configure one memory string. By arranging a plurality of memory strings in the X and Y directions, the plurality of memory cells MC1 to MC8 are three-dimensionally provided in the X, Y, and Z directions.

Here, in the stacked body in which the plurality of conductive layers WL1 to WL4 and the insulating layers 30a are alternately stacked, a lithographic mark such as an alignment mark or an inspection mark is provided. Further, in the stacked body in which the plurality of conductive layers WL1 to WL4 and the insulating layers 30a are alternately stacked, a mark for inspecting a photo mask may be transferred. Hereinafter, the lithographic mark and the mark for inspecting a photo mask may be simply referred to as a mark.

In this case, if a sacrificial layer 60 is removed by a substitution process which will be described below, the conductive layers WL1 to WL4 are not supported in a portion where the mark is provided. Accordingly, the stacked conductive layers WL1 to WL4 may be undesirably partially collapsed.

In order to suppress the stacked conductive layers WL1 to WL4 from being collapsed, an impurity such as boron (B) is added to an edge of the sacrificial layer 60 exposed onto an inner wall of the mark so that the edge of the sacrificial layer 60 may not be removed. However, in case of a mark having a higher aspect ratio, it is difficult to add the impurity to the lower portion of the mark. Therefore, the amount of added impurity is not sufficient, which may not suppress the stacked conductive layers WL1 to WL4 from being collapsed.

In the semiconductor device 1 according to the embodiment, a supporting unit that is provided around the mark which is opened onto a surface of the stacked body and extends in a stacked direction of the stacked body is provided.

FIGS. 3 to 5 are schematic views for illustrating the supporting units 50a to 50c which are provided around the marks 70a to 70c, respectively.

Figure 3A:
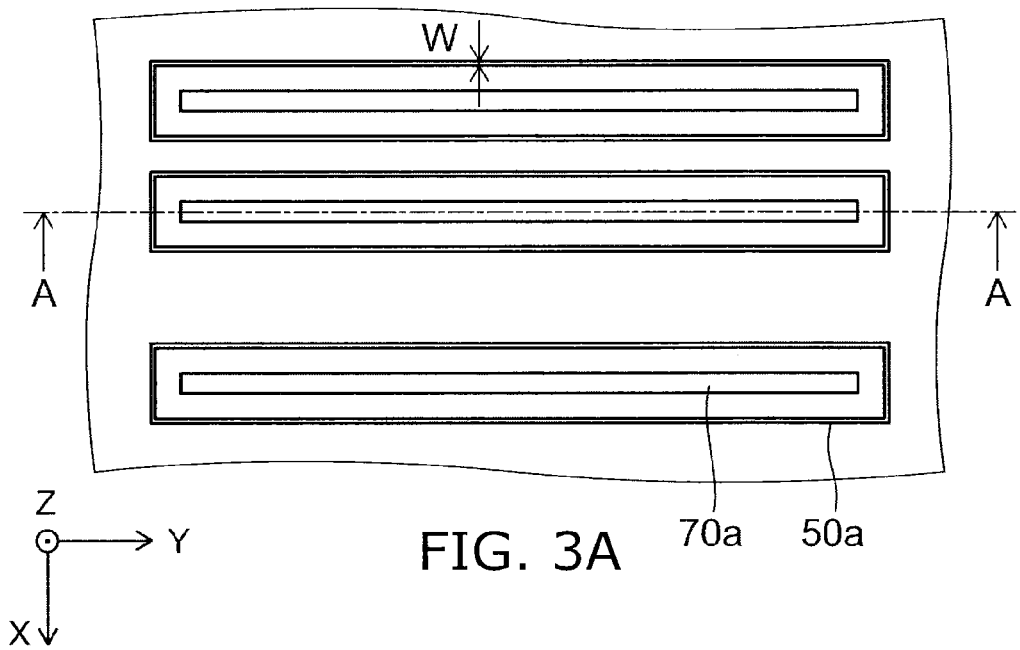
FIGS. 3A and 3B are schematic views for illustrating the supporting unit 50$a$ which is provided around the mark 70$a$.
Figure 3B:
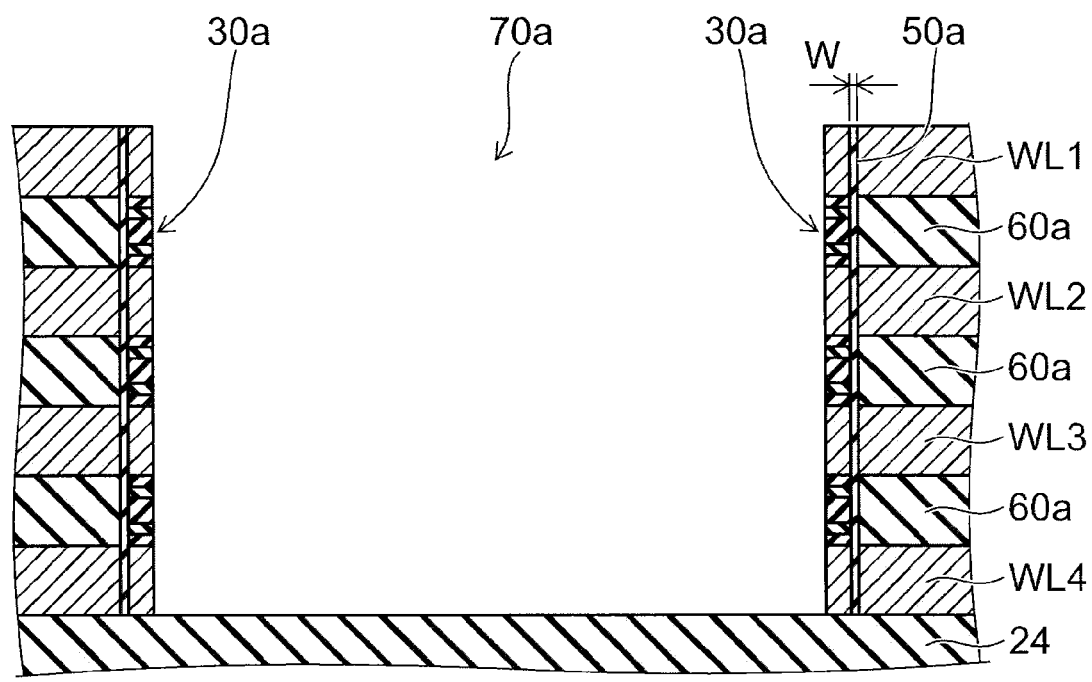
Figure 4A:
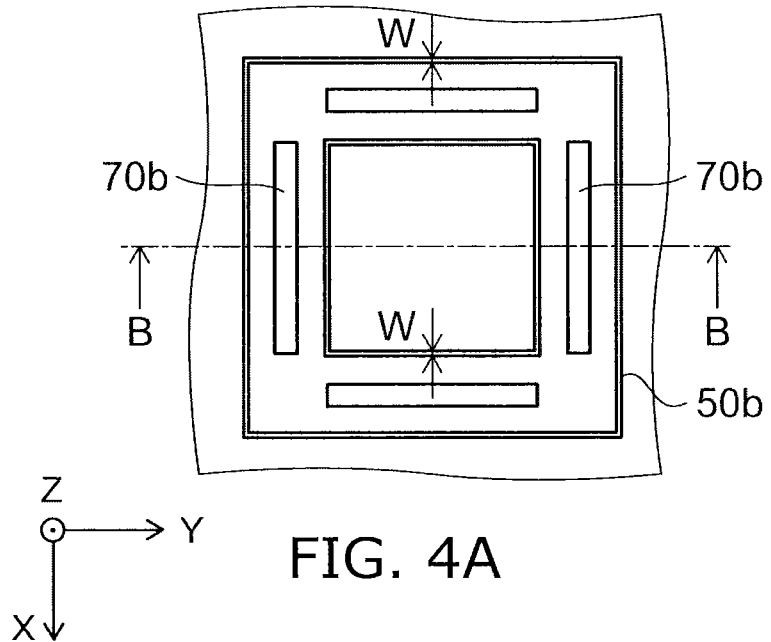
FIGS. 4A and 4B are schematic views for illustrating the supporting unit 50$b$ which is provided around the mark 70$b$.
Figure 4B:
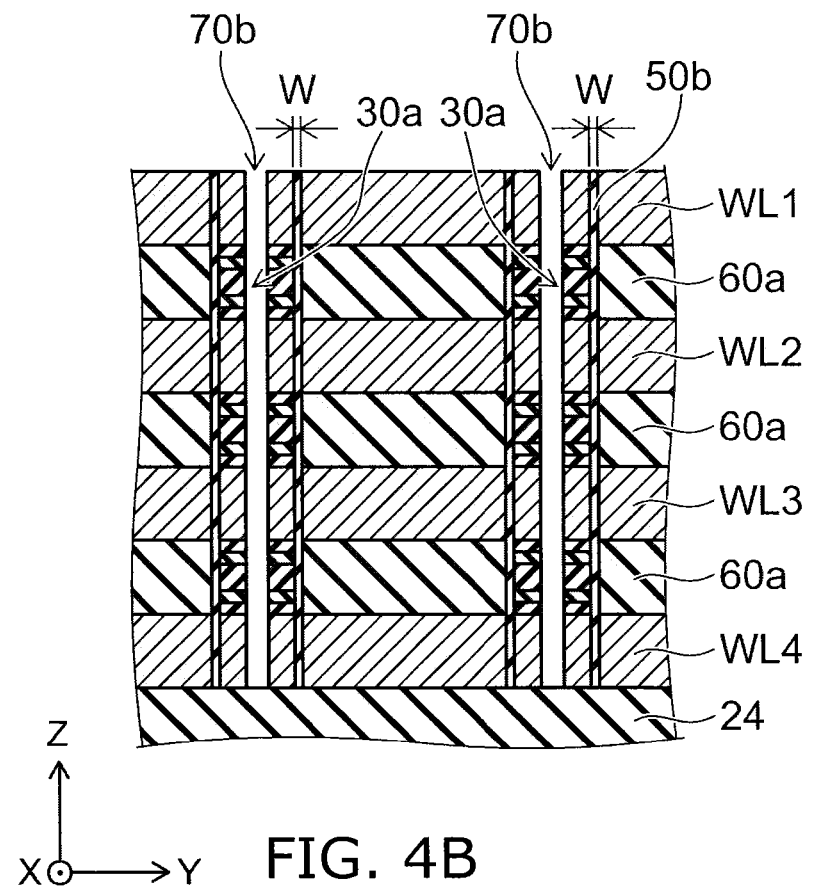
Figure 5A:
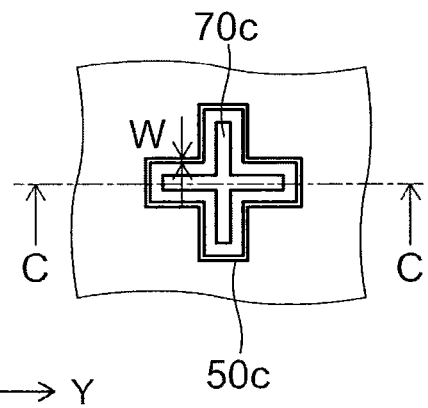
FIGS. 5A and 5B are schematic views for illustrating the supporting unit 50$c$ which is provided around the mark 70$c$.
Figure 5B:
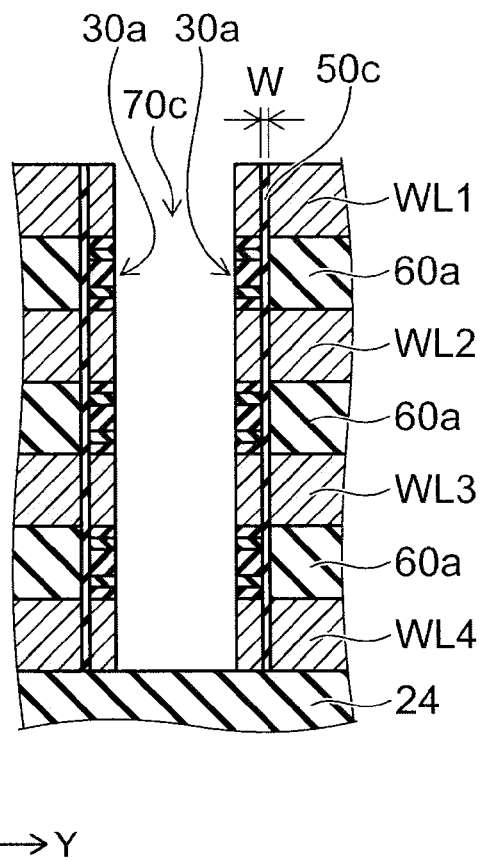

Further, FIG. 3B illustrates a cross-section taken along the arrow A-A in FIG. 3A, FIG. 4B illustrates a cross-section taken along the arrow B-B in FIG. 4A, and FIG. 5B illustrates a cross-section taken along the arrow C-C in FIG. 5A.

In addition, FIGS. 3 to 5 illustrate the marks 70a to 70c and the supporting units 50a to 50c provided in a region where a mark is formed (a mark forming region 1c) as examples.

The mark forming region 1a refers to, for example, a region which is adjacent to the element region 1a or the contact region 1b and becomes a scribe line as illustrated in FIGS. 7 to 13.

The mark 70a illustrated in FIG. 3 illustrates an alignment mark.

The mark 70b illustrated in FIG. 4 illustrates an inspection mark.

The mark 70c illustrated in FIG. 5 illustrates a mark for inspecting a photo mask.

Further, the layer 60a provided between the conductive layers WL1 to WL4 is the sacrificial layer 60 which is not removed but remains. The forming of the layer 60a will be described below.

As illustrated in FIGS. 3 to 5, frame shaped supporting units 50a to 50c may be provided around the marks 70a to 70c opened onto the surface of the stacked body so as to enclose the marks 70a to 70c.

The supporting units 50a to 50c are provided so as to extend from the upper surface of the uppermost conductive layer WL1 to the lower surface of the lowermost conductive layer WL4 in the stacked direction (Z-direction).

In other words, in order to suppress the stacked conductive layers WL1 to WL4 from being collapsed, the supporting units 50a to 50c are in contact with at least the conductive layers WL1 to WL4.

Materials for the supporting units 50a to 50c are not specifically limited, but it is favorable to form the supporting units 50a to 50c using a material that is hardly removed in the substitution process which will be described below. In other words, a material having an etching rate which is lower than an etching rate of a material for the sacrificial layer 60 is favorably used to form the supporting units 50a to 50c. For example, the sacrificial layer 60 may be made of silicon to which no impurity is added and the supporting units 50a to 50c may be made of a silicon nitride.

The marks 70a and 70b are captured by an image capturing device such as a CCD (charge coupled device) camera and a predetermined processing is performed thereon based on captured image data. Therefore, it is favorable that the supporting units 50a to 50c are not captured by the image capturing device. For example, if a width dimension W of the supporting units 50a to 50c is set to be not more than a resolution detection limit of the image capturing device, the supporting units 50a to 50c may not be captured by the image capturing device. In this case, in order to capture the marks 70a to 70c by the image capturing device while the supporting units 50a to 50c are not captured, it is favorable to set the width dimension W of the supporting units 50a to 50c to be 100 nm or less.

Further, by performing the image processing, the image data of the supporting units 50a to 50c may be removed. For example, a pattern which is the same as that of the supporting units 50a to 50c is captured in advance and image data of the pattern which is the same as that of the supporting units 50a to 50c are removed from the image data of the marks 70a to 70c and the supporting units 50a to 50c.

In the substitution process which will be described below, the sacrificial layer 60 provided between the conductive layers WL1 to WL4 is removed and an insulating layer 30a is formed in a portion where the sacrificial layer 60 is removed.

In the marks 70a to 70c, the sacrificial layer 60 is removed from the inner wall sides of the marks 70a to 70c and the insulating layer 30a is formed in a portion where the sacrificial layer 60 is removed. Therefore, when the sacrificial layer 60 is removed from the inner wall sides of the marks 70a to 70c, if the stacked conductive layers WL1 to WL4 are not supported, the stacked conductive layers WL1 to WL4 may be undesirably partially collapsed.

In the embodiment, around the marks 70a to 70c, the supporting units 50a to 50c that extend in the stacked direction of the stacked body are provided. Accordingly, even though the sacrificial layer 60 is removed from the inner wall sides of the marks 70a to 70c, the stacked conductive layers WL1 to WL4 may be supported.

Further, since the supporting units 50a to 50c are provided so as to enclose the marks 70a to 70c, it is possible to prevent the sacrificial layer 60 which is disposed outside the supporting units 50a to 50c from being removed. Therefore, it is possible to surely suppress the stacked conductive layers WL1 to WL4 from being collapsed.

In addition, if the width dimension W of the supporting units 50a to 50c is set to be 100 nm or less, the supporting units 50a to 50c may not be captured by the image capturing device FIG. 6 is a schematic view for illustrating a supporting unit 50d according to another embodiment.

Figure 6A:
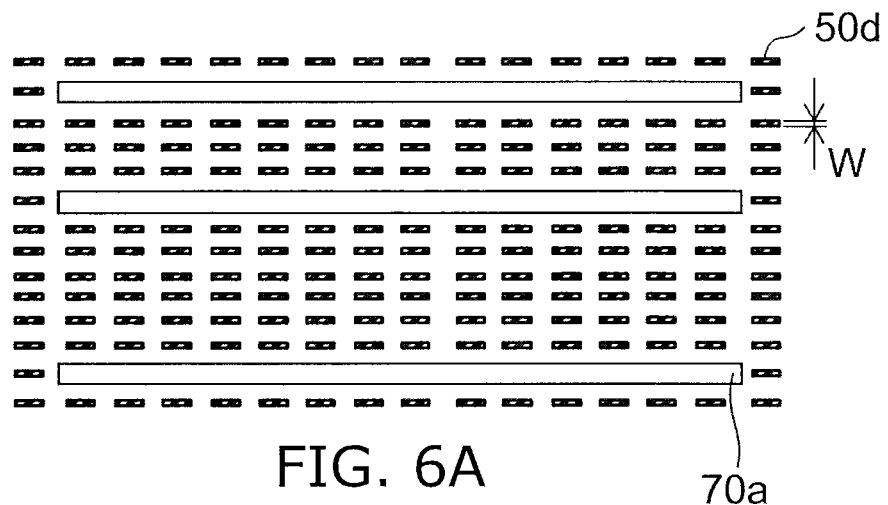
FIGS. 6A to 6C are a schematic view for illustrating a supporting unit 50$d$ according to another embodiment.
Figure 6B:
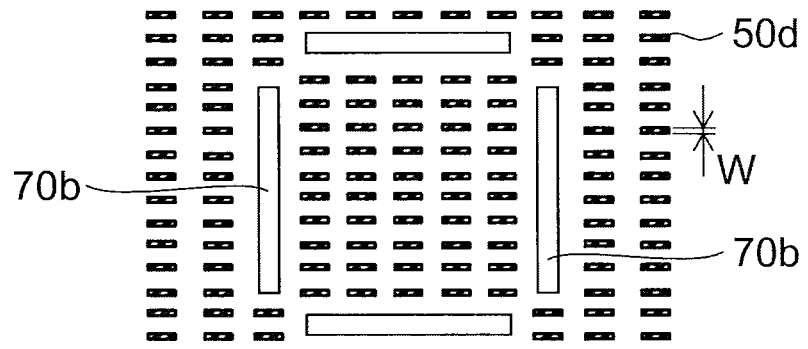
Figure 6C:
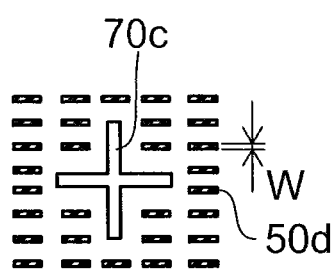

FIG. 6A illustrates that the supporting unit 50d is provided for a mark 70a which is an alignment mark, FIG. 6B illustrates that the supporting unit 50d is provided for a mark 70b which is an inspection mark, and FIG. 6C illustrates that the supporting unit 50d is provided for a mark 70c which is a mark for inspecting a photo mask.

As illustrated in FIGS. 6A to 6C, dot shaped supporting units 50d may be provided. Even though the number of supporting units 50d is not specifically limited, if at least one supporting unit 50d is provided around the marks 70a to 70c, it is possible to suppress the stacked conductive layers WL1 to WL4 from being collapsed.

If a plurality of dot shaped supporting units 50d are provided around the marks 70a to 70c so as to enclose the marks 70a to 70c, it is possible to surely suppress the stacked conductive layers WL1 to WL4 from being collapsed.

In this case, the plurality of supporting units 50d may be regularly disposed as illustrated in FIGS. 6A to 6C or the plurality of supporting units 50d may be disposed in an arbitrary position.

Similarly to the supporting units 50a to 50c, the supporting unit 50d is provided so as to extend from the upper surface of the uppermost conductive layer WL1 to the lower surface of the lowermost conductive layer WL4 in the stacked direction (Z-direction).

A material for the supporting unit 50d may be the same as the material for the supporting units 50a to 50c described above.

Further, similarly to the supporting units 50a to 50c, a width dimension W of the supporting unit 50d is favorably set to be 100 nm or less. By doing this, the supporting unit 50d may not be captured by the image capturing device. If the width dimension W of the supporting unit 50d is large so that the supporting unit 50d is captured by the image capturing device, it is possible to remove image data of the supporting unit 50d by performing an image processing similarly to the cases of the supporting units 50a to 50c.

If the dot shaped supporting unit 50d that extends in the stacked direction of the stacked body is provided, it is possible to support the stacked conductive layers WL1 to WL4. Therefore, it is possible to suppress the stacked conductive layers WL1 to WL4 from being collapsed.

As compared with the frame shaped supporting units 50a to 50c which have been described above, the dot shaped supporting unit 50d less effectively supports the stacked conductive layers WL1 to WL4, but can make it harder for the image capturing unit to capture the supporting unit.

Therefore, in accordance with the shape, the size, or the disposed position of the mark, it is possible to choose the frame shaped supporting unit 50a to 50c or the dot-shaped supporting unit 50d.

Even though the marks 70a to 70c and the supporting units 50a to 50d which are provided in the element region 1a are configured as described above, a mark and a supporting unit that are provided in other region (for example, the contact region or the peripheral circuit region) of the semiconductor device 1 may be similarly configured.

Further, the shapes or disposed positions of the mark and the supporting unit are not limited to the above-mentioned examples, but may be appropriately changed.

[Second Embodiment]

Next, a method of manufacturing a semiconductor device 1 according to a second embodiment will be illustrated.

First, the forming of elements provided in a contact region 1b and marks 70 provided in a mark forming region 1c will be illustrated.

The contact region 1b refers to a region where a contact electrode for connecting a conductive layer WL to an upper layer interconnect is provided.

The mark forming region 1c refers to, for example, a region that is adjacent to the contact region 1b and becomes a scribe line.

FIGS. 7 to 9 are schematic process cross-sectional views for illustrating the forming of elements provided in the contact region 1b and marks 70 provided in the mark forming region 1c.

Figure 7A:
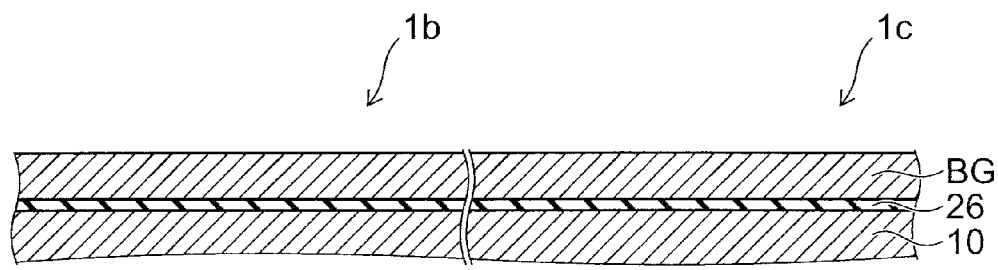
FIGS. 7A and 7B are schematic process cross-sectional views for illustrating the forming of elements provided in the contact region 1$b$ and marks 70 provided in the mark forming region 1$c$.

First, as illustrated in FIG. 7A, an insulating layer 26 is formed on a substrate 10 and a back gate BG is formed on the insulating layer 26.

The insulating layer 26 and the back gate BG may be formed using, for example, a CVD (chemical vapor deposition) method. In this case, the insulating layer 26 may be, for example, made of a silicon oxide. The back gate BG may be, for example, made of conductive silicon to which an impurity such as boron is added.

Figure 7B:
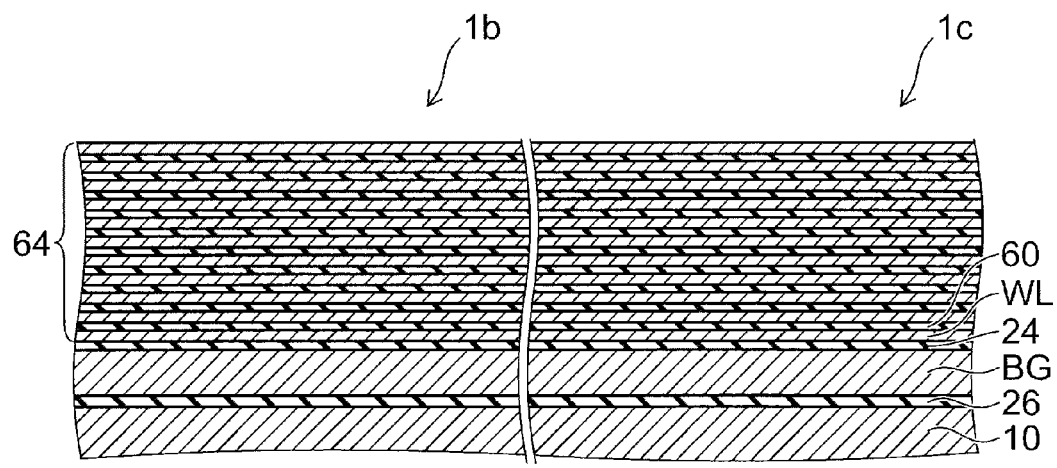

Next, as illustrated in FIG. 7B, an insulating layer 24 is formed on the back gate BG and a plurality of conductive layers WL and a plurality of sacrificial layers 60 are alternately stacked on the insulating layer 24 to form the stacked body 64. The number of stacked conductive layers WL is not specifically limited, but eleven conductive layers WL are stacked in FIG. 7B.

Further, the insulating layer 24 and the stacked body 64 may be formed together in the element region 1a, the contact region 1b, and the mark forming region 1c.

The insulating layer 24, the conductive layer WL, and the sacrificial layer 60 may be formed, for example, by a CVD method. In this case, the insulating layer 24 may be made, for example, of a silicon oxide. The conductive layer WL may be made, for example, of conductive silicon to which an impurity such as boron is added. The sacrificial layer 60 may be made, for example, of silicon to which no impurity is added.

Figure 8A:
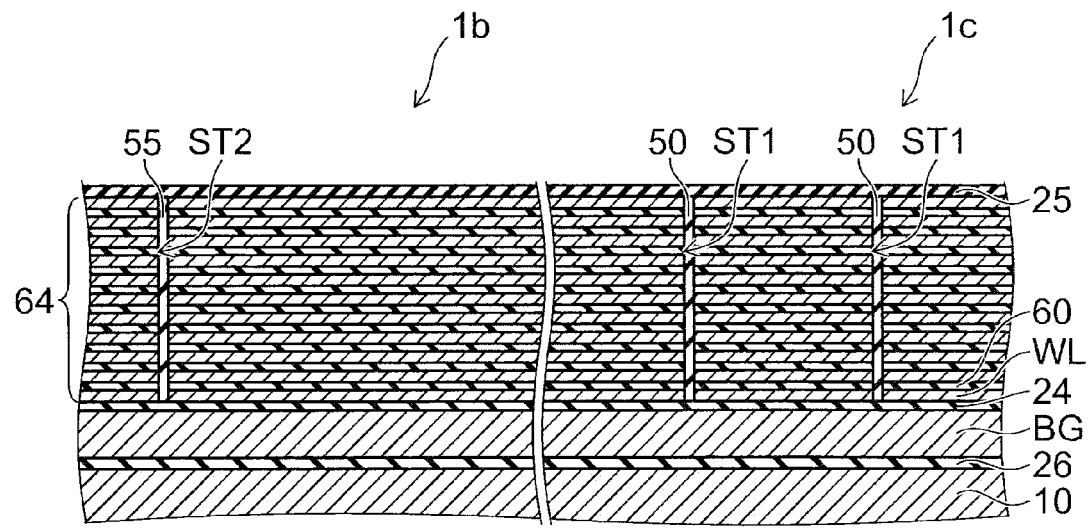
FIGS. 8A and 8B are schematic process cross-sectional views for illustrating the forming of elements provided in the contact region 1$b$ and marks 70 provided in the mark forming region 1$c$.

Next, as illustrated in FIG. 8A, a supporting unit 50 that extends in a stacked direction of the stacked body is formed in a predetermined position of the mark forming region 1c. Further, a supporting unit 55 that extends in a stacked direction of the stacked body is formed in a predetermined position of the contact region 1b.

For example, grooves ST1 and ST2 that extend from the upper surface of the uppermost conductive layer WL to the lower surface of the lowermost conductive layer WL in the stacked direction (Z-direction) are formed, films made of a predetermined material are formed inside the grooves ST1 and ST2, and films formed in a portion other than the inside of the grooves ST1 and ST2 are removed by etching-back to form the supporting units 50 and 55.

In this case, the supporting unit 50 may be provided so as to enclose a portion in which a hole 71 which will be the mark 70 is formed.

Thereafter, an insulating layer 25 is formed on the stacked body 64.

The grooves ST1 and ST2 may be formed using, for example, a photolithographic method and an RIE (reactive ion etching) method.

The supporting units 50 and 55 and the insulating layer 25 may be formed by a CVD method.

The supporting unit 50 is provided in order to support the conductive layer WL around the mark 70 and the supporting unit 55 is provided in order to support the conductive layer WL in a portion where the contact electrode is provided.

The groove ST1 for forming the supporting unit 50 is formed around a portion where the mark 70 is formed. For example, the groove ST1 for forming the above-mentioned supporting units 50a to 50d is formed around a portion where the marks 70a to 70c are formed.

The position where the groove ST2 for forming the supporting unit 55 is formed is not specifically limited, but the groove ST2 may be formed in a position that may suppress the stacked conductive layers WL from being collapsed when the substitution process which will be described below is performed. Further, the shape of the groove ST2 is not specifically limited, but may be appropriately set. For example, the shape of the groove ST2 may be a flat film shape.

A material for the supporting units 50 and 55 is not specifically limited, but the supporting units 50 and 55 are preferably made of a material that is hardly removed in the substitution process which will be described below. In other words, the supporting units 50 and 55 are favorably formed using a material having an etching rate lower than an etching rate of a material for the sacrificial layer 60. For example, the sacrificial layer 60 is made of silicon to which no impurity is added and the supporting units 50 and 55 may be made of a silicon nitride.

A width dimension W of the supporting units 50 and 55 is favorably 100 nm or less. By doing this, the supporting units 50 and 55 may not be captured by the image capturing device.

The insulating layer 25 may be made of, for example, a silicon oxide.

Figure 8B:
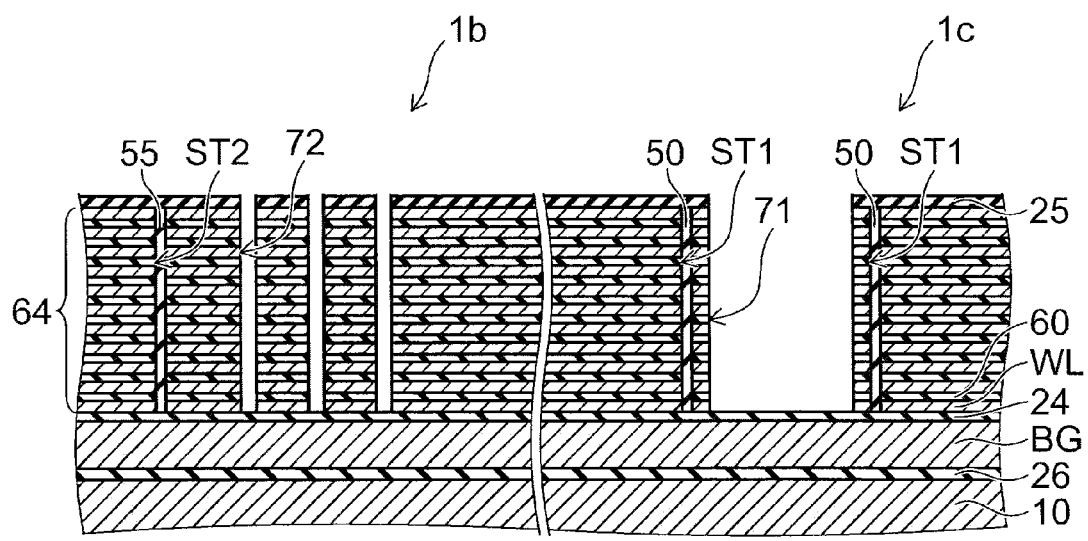

Next, as illustrated in FIG. 8B, a hole 71 (corresponding to an example of a second hole) which will be the mark 70 opened onto the surface of the stacked body 64 around the supporting unit 50 is formed. Further, in a predetermined position, a hole 72 (corresponding to an example of a first hole) that passes through the stacked body 64 in the stacked direction is formed.

The holes 71 and 72 may be formed, for example, by a photolithographic method and an RIE method.

The hole 71 is used to form the mark 70 and the hole 72 is used to perform the substitution process.

Next, as illustrated in FIG. 9, the substitution process is performed.

Figure 9A:
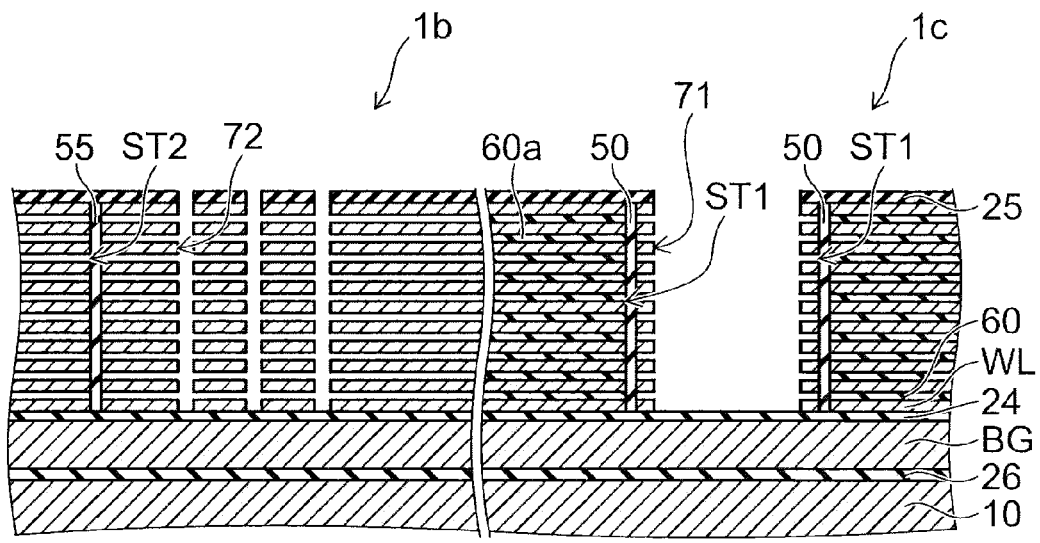
FIGS. 9A and 9B are schematic process cross-sectional views for illustrating the forming of elements provided in the contact region 1$b$ and marks 70 provided in the mark forming region 1$c$.

In the substitution process, first, as illustrated in FIG. 9A, the sacrificial layer 60 is removed through the hole 72. In this case, the stacked conductive layers WL may be supported by the supporting unit 55 so that it is possible to suppress the stacked conductive layers WL from being collapsed.

Further, even though the sacrificial layer 60 is removed from the inner wall side of the hole 71, since the stacked conductive layers WL are supported by the supporting unit 50, it is possible to suppress the stacked conductive layers WL from being collapsed.

The sacrificial layer 60 may be removed using a wet etching method that uses, for example, a choline aqueous solution (TMY).

Figure 9B:
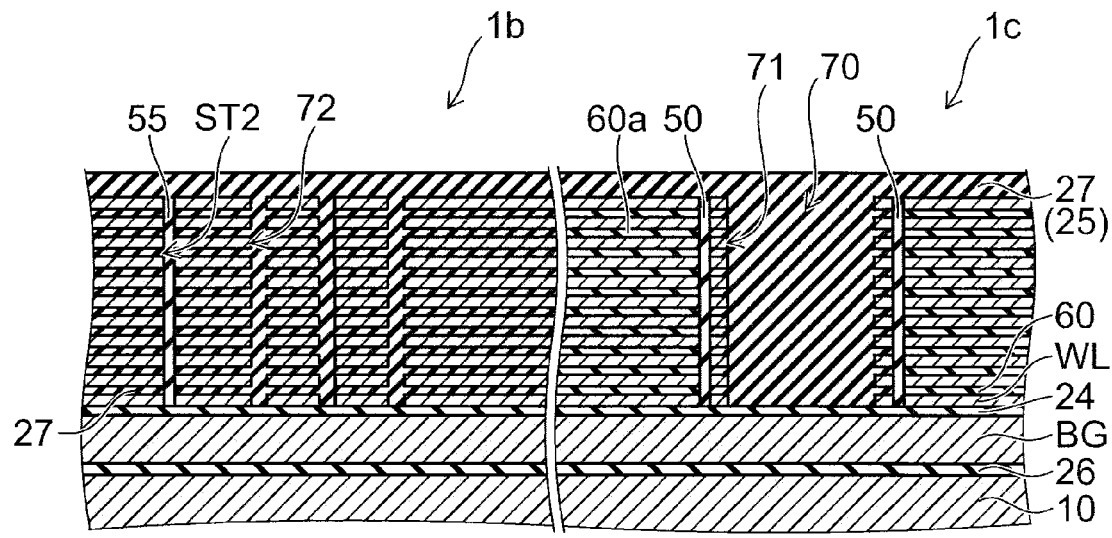

Next, as illustrated in FIG. 9B, an insulating layer 27 is formed between the conductive layers WL through the hole 72.

In this case, the insulating layer 27 is formed on the insulating layer 25, on the inner wall of the hole 71, and inside the hole 72.

Further, by forming the insulating layer 27 on the inner wall of the hole 71, the mark 70 opened onto the surface of the stacked body is formed.

The insulating layer 27 may be formed using, for example, an ALD (atomic layer deposition) method.

The insulating layer 27 may be made of, for example, a silicon oxide. When the insulating layers 25 and 27 are made of a silicon oxide, the insulating layers 25 and 27 are integrated to each other.

Thereafter, in the contact region 1b, contact electrodes that extend in the stacked direction of the stacked body and reach corresponding conductive layers WL and back gate BG but are not illustrated in the drawing are formed.

As described above, the elements provided in the contact region 1b and the marks 70 provided in the mark forming region 1c may be formed.

Next, the forming of the elements provided in the element region 1a and the marks 70 provided in the mark forming region 1c will be illustrated.

FIGS. 10 to 13 are schematic process cross-sectional views for illustrating the forming of elements provided in the element region 1a and marks 70 provided in the mark forming region 1c.

The element region 1a refers to a region where semiconductor elements are provided.

The mark forming region 1c refers to, for example, a region which is adjacent to the element region 1a and becomes a scribe line.

Figure 10A:
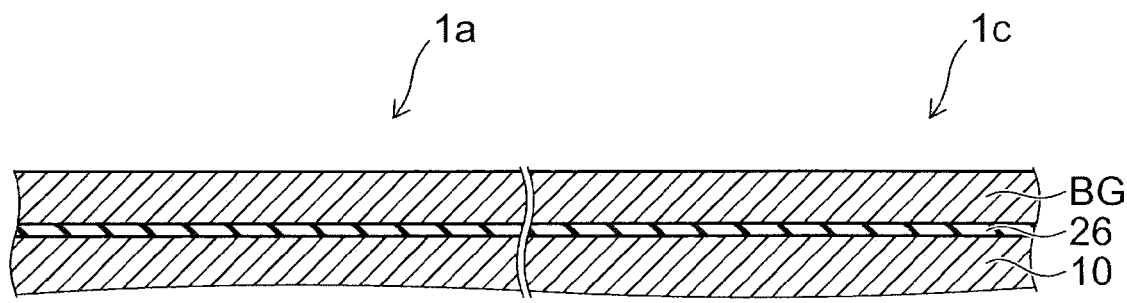
FIGS. 10A and 10B are schematic process cross-sectional views for illustrating the forming of elements provided in the element region 1$a$ and marks 70 provided in the mark forming region 1$c$.
Figure 10A:
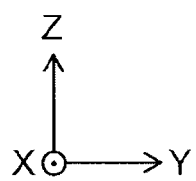

First, as illustrated in FIG. 10A, an insulating layer 26 is formed on a substrate 10 and a back gate BG is formed on the insulating layer 26.

The insulating layer 26 and the back gate BG are formed together with the insulating layer 26 and the back gate BG in the contact region 1b and the mark forming region 1c illustrated in FIG. 7A.

Figure 10B:
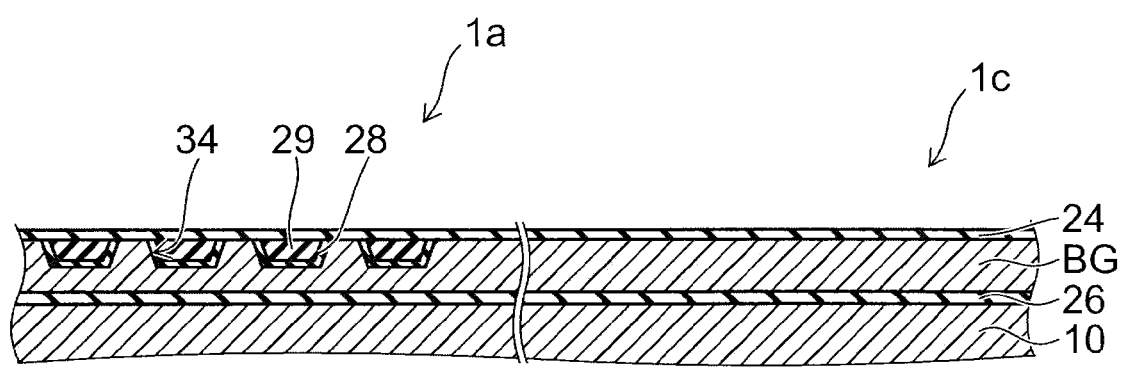
Figure 10B:
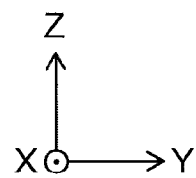

Next, as illustrated in FIG. 10B, in the element region 1a, a groove 34 is formed in the back gate BG by a photolithographic method and an RIE method. The position of the groove 34 corresponds to a portion of a U-shaped memory hole that is formed in the back gate BG and extends in the Y-direction.

Continuously, an insulating layer 28 is formed in the groove 34 and a sacrificial layer 29 is formed in the groove 34 with the insulating layer 28 interposed therebetween. The sacrificial layer 29 may be made of silicon to which no impurity is added. The remaining portion of the sacrificial layer 29 is removed by etching-back and a surface of the back gate BG between the adjacent sacrificial layers 29 is exposed.

Continuously, an insulating layer 24 is formed on the sacrificial layer 29 and the back gate BG.

The insulating layers 24, 28, and the sacrificial layer 29 may be formed by, for example, a CVD method.

Further, the insulating layers 24 may be formed together in the element region 1a, the contact region 1b, and the mark forming region 1c.

Figure 11A:
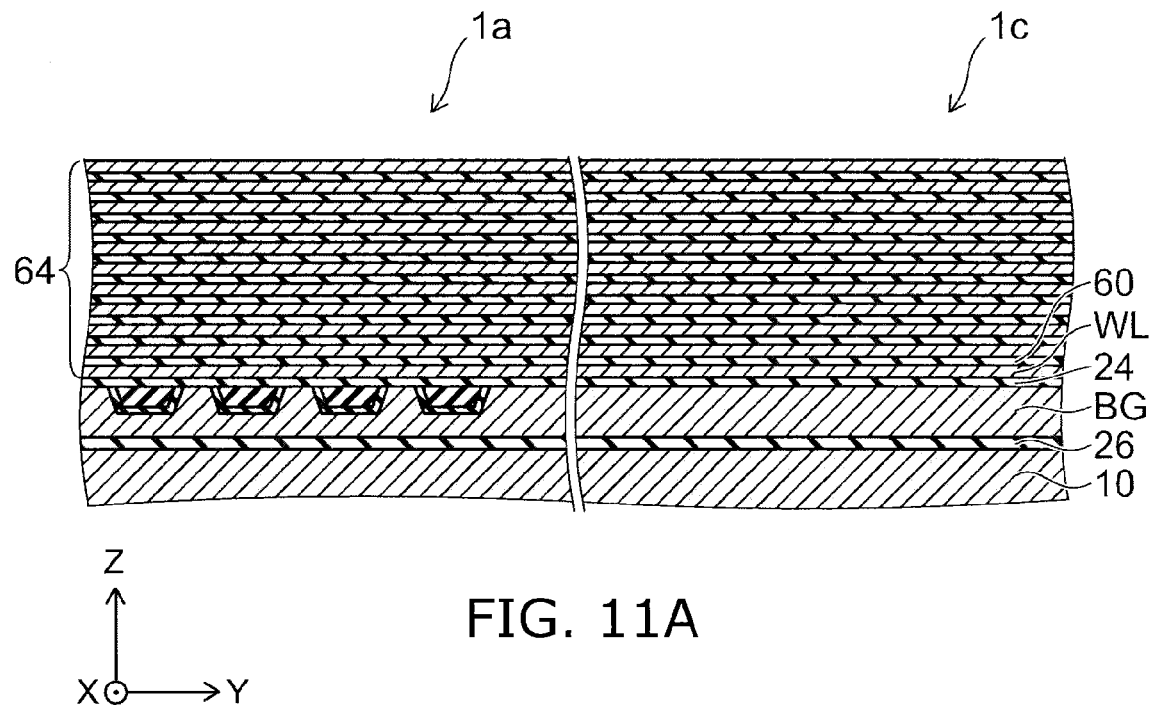
FIGS. 11A and 11B are schematic process cross-sectional views for illustrating the forming of elements provided in the element region 1$a$ and marks 70 provided in the mark forming region 1$c$.

Next, as illustrated in FIG. 11A, a plurality of conductive layers WL and a plurality of sacrificial layers 60 are alternately stacked on the insulating layer 24 to form a stacked body 64.

Further, the stacked bodies 64 may be formed together in the element region 1a, the contact region 1b, and the mark forming region 1c.

Figure 11B:
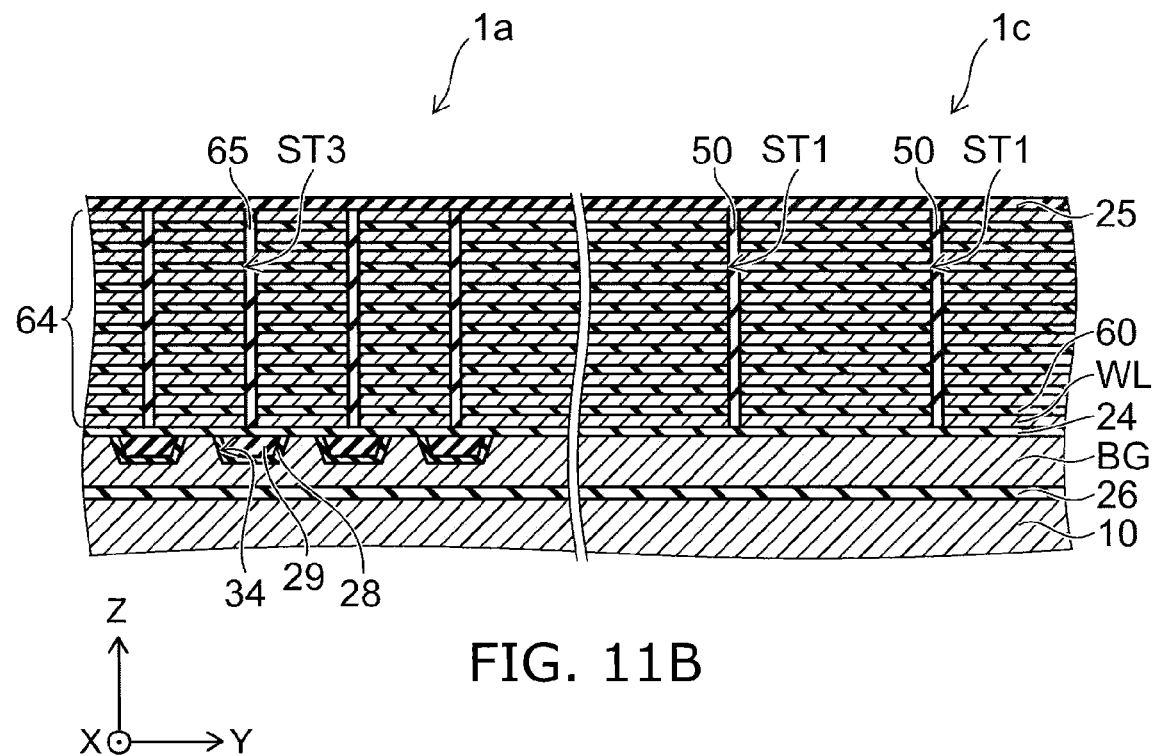

Next, as illustrated in FIG. 11B, a supporting unit 50 that extends in a stacked direction of the stacked body 64 is formed in a predetermined position of the mark forming region 1c. Further, a supporting unit 65 that extends in a stacked direction of the stacked body 64 is formed in a predetermined position of the element region 1a.

The supporting units 50 and 65 may be formed the same as illustrated in FIG. 8A.

For example, grooves ST1 and ST3 that extend from the upper surface of the uppermost conductive layer WL to the lower surface of the lowermost conductive layer WL in the stacked direction (Z-direction) are formed, films made of a predetermined material are formed inside the grooves ST1 and ST3, and films formed in a portion other than the inside of the grooves ST1 and ST3 are removed by etching-back to form the supporting units 50 and 65.

In this case, the supporting unit 50 may be provided so as to enclose a portion in which a hole 71a which will be the mark 70 is formed.

Thereafter, an insulating layer 25 is formed on the stacked body 64.

The supporting unit 65 is provided in order to support the conductive layers WL in a portion where a silicon body 20 is provided.

The groove ST3 may be formed above the groove 34.

The forming method of the groove ST3 is the same as the forming method of the groove ST2.

The forming method, the material, and the width dimension W of the supporting unit 65 may be the same as those of the supporting unit 55.

Further, the grooves ST1 and ST3, the supporting units 50 and 65, and the insulating layer 25 may be formed together in the element region 1a, the contact region 1b, and the mark forming region 1c.

Figure 12A:
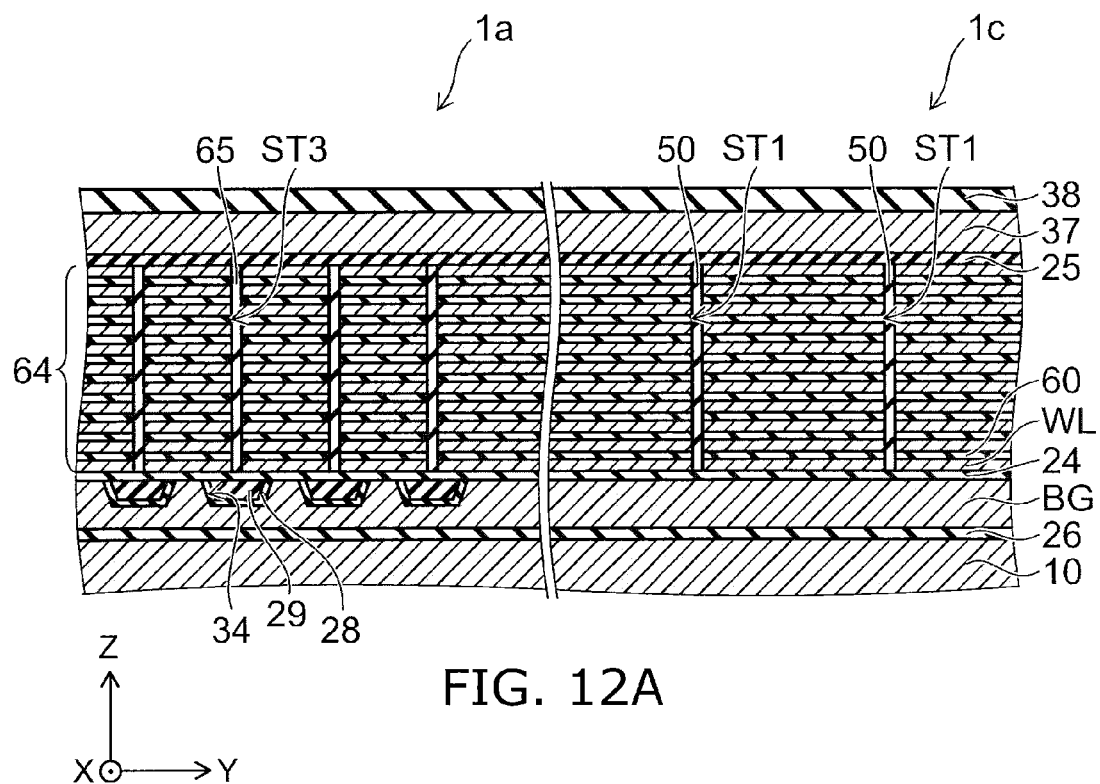
FIGS. 12A and 12B are schematic process cross-sectional views for illustrating the forming of elements provided in the element region 1$a$ and marks 70 provided in the mark forming region 1$c$.

Next, as illustrated in FIG. 12A, a layer 37 which becomes a drain side selective gate DSG and a source side selective gate SSG is formed on the insulating layer 25 and an insulating layer 38 is formed on the layer 37.

The layer 37 and the insulating layer 38 may be formed, for example, by a CVD method.

The layer 37 may be made of conductive silicon to which an impurity such as boron is added.

The insulating layer 38 may be made, for example, of a silicon oxide.

Figure 12B:
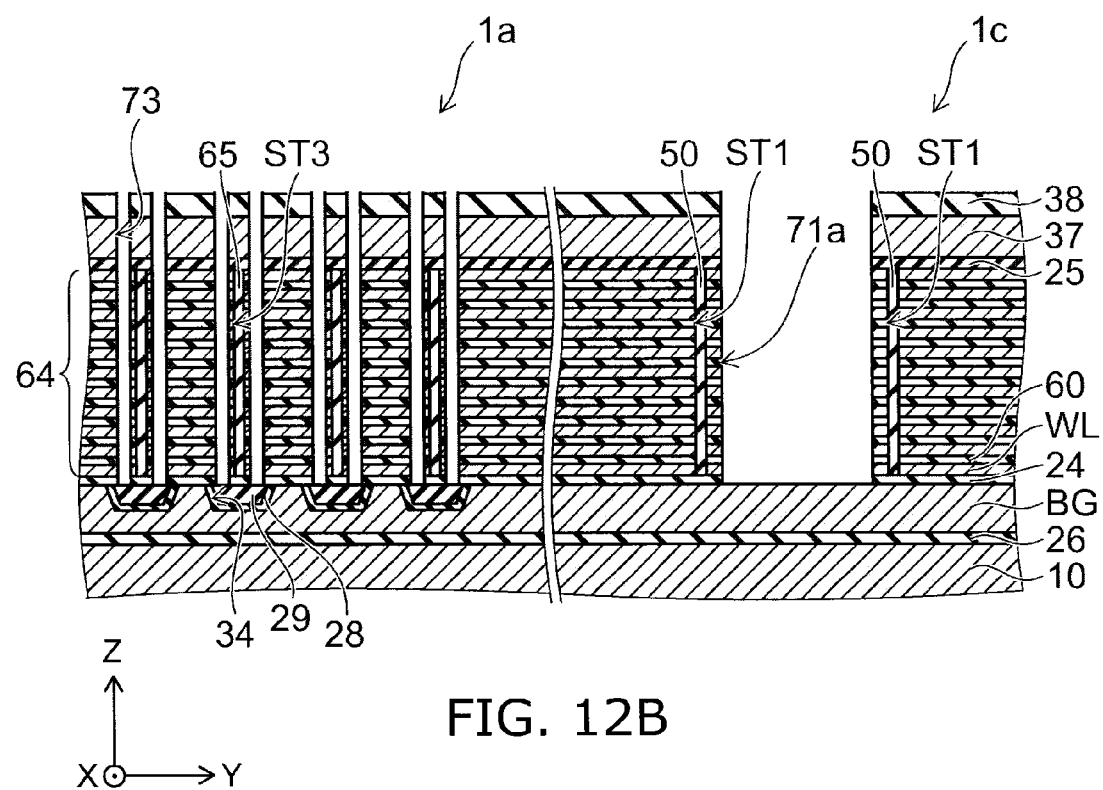

Next, as illustrated in FIG. 12B, using a photolithographic method and an RIE method, a hole 71a (corresponding to an example of a second hole) is formed in a predetermined position of the mark forming region 1c and a memory hole 73 (corresponding to an example of a first hole) is formed in a predetermined position of the element region 1a.

The hole 71a which becomes a mark 70 opened onto a surface of a stacked body formed of the insulating layer 38, the layer 37, the insulating layer 25, the stacked body 64, and the insulating layer 24 is formed around the supporting unit 50.

The memory hole 73 (corresponding to an example of a first hole) that passes through the stacked body formed of the insulating layer 38, the layer 37, the insulating layer 25, the stacked body 64, and the insulating layer 24 in a stacked direction is formed in a predetermined position.

The hole 71a may be formed the same as the hole 71 described above.

A pair of the memory holes 73 is formed for one sacrificial layer 29. The lower edge of the memory hole 73 reaches the sacrificial layer 29 and a sacrificial layer 60 provided between the plurality of conductive layers WL is exposed inside the memory hole 73.

Next, as illustrated in FIG. 13, a substitution process is performed.

Figure 13A:
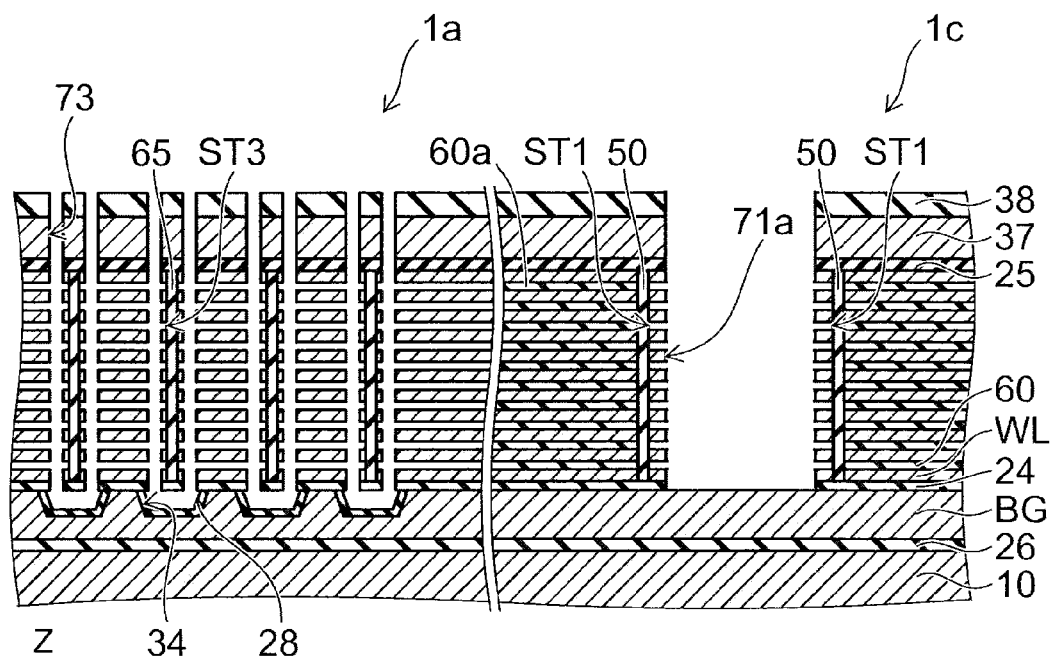
FIGS. 13A and 13B are schematic process cross-sectional views for illustrating the forming of elements provided in the element region 1$a$ and marks 70 provided in the mark forming region 1$c$.

In the substitution process, first, as illustrated in FIG. 13A, the sacrificial layer 60 is removed through the memory hole 73. In this case, the stacked conductive layers WL may be supported by the supporting unit 65 so that it is possible to suppress the stacked conductive layers WL from being collapsed.

Further, even though the sacrificial layer 60 is removed from the inner wall side of the hole 71a, since the stacked conductive layers WL can be supported by the supporting unit 50, it is possible to suppress the stacked conductive layers WL from being collapsed.

The sacrificial layer 60 may be removed using a wet etching method that uses, for example, a choline aqueous solution (TMY).

Figure 13B:
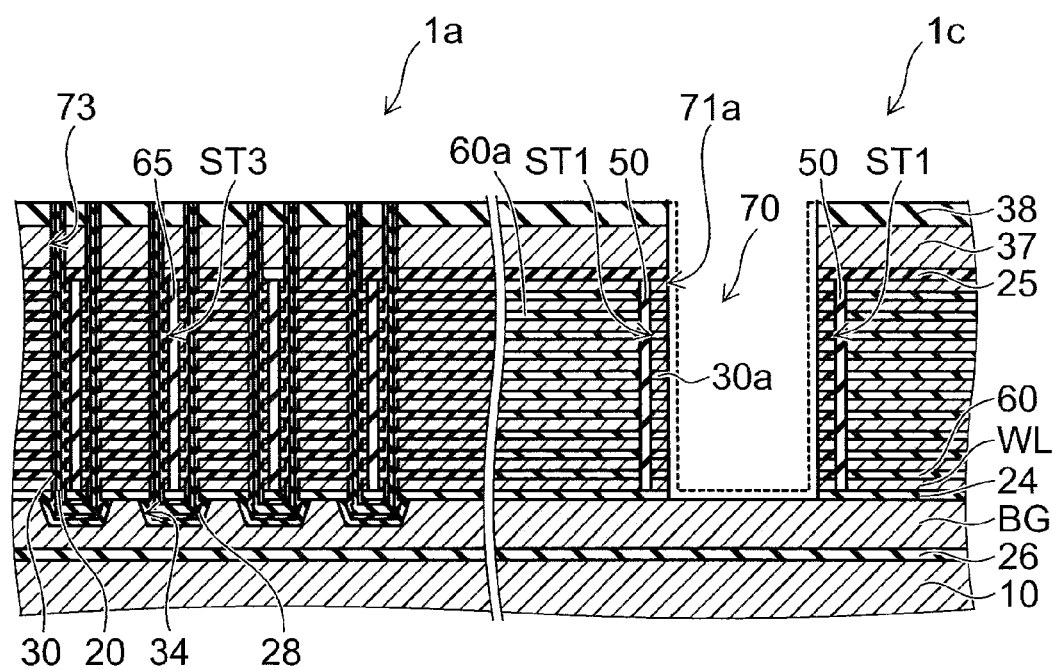

Next, as illustrated in FIG. 13B, an insulating film 30a is formed between the conductive layers WL through the memory hole 73.

In this case, the insulating film 30 is formed on the insulating layer 38, on the inner wall of the hole 71a, and on the inner wall of the memory hole 73.

As described above, the insulating film 30a is formed of two layers so as to face the insulating film 30.

The insulating film 30 has an ONO structure and may be formed by stacking a first insulating film 31, a charge storage layer 32, and a second insulating film 33 in this order.

Continuously, a silicon body 20 is formed at the inner side of the insulating film 30 formed on the inner wall of the memory hole 73.

The first insulating film 31, the charge storage layer 32, the second insulating film 33, and the silicon body 20 may be formed using, for example, an atomic layer deposition method.

The insulating film 30 formed on the insulating layer 38 and on the inner wall of the hole 71a is etched-back to be removed.

By etching back the insulating film 30 formed on the inner wall of the hole 71a to be removed, a mark 70 opened onto the surface of the stacked body 64 is formed.

As described above, elements provided in the element region 1a and a mark 70 provided in the mark forming region 1c may be formed.

Further, a mark and a supporting unit that are provided in the mark forming region 1c adjacent to other region (for example, a peripheral circuit region) of the semiconductor device 1 may be formed the same as the above.

In addition, since a known technology may be applied to form other elements provided in the semiconductor device 1, the description thereof will be omitted.

As described above, the semiconductor device 1 is manufactured.

In the embodiment, since the supporting unit 50 is provided around a portion where the mark 70 is formed, even though the sacrificial layer 60 is removed, the stacked conductive layers WL may be supported.

Therefore, it is possible to suppress the stacked conductive layers WL from being collapsed.

In this case, if like the supporting units 50a to 50d described above, the supporting unit 50 is formed so as to enclose the mark 70, it is possible to prevent the sacrificial layer 60 which is disposed outside the supporting unit 50 from being removed. Therefore, it is possible to surely suppress the stacked conductive layers WL from being collapsed.

Further, if the width dimension W of the supporting unit 50 is set to be 100 nm or less, the supporting unit 50 may not be captured by the image capturing device.

Figure 14:
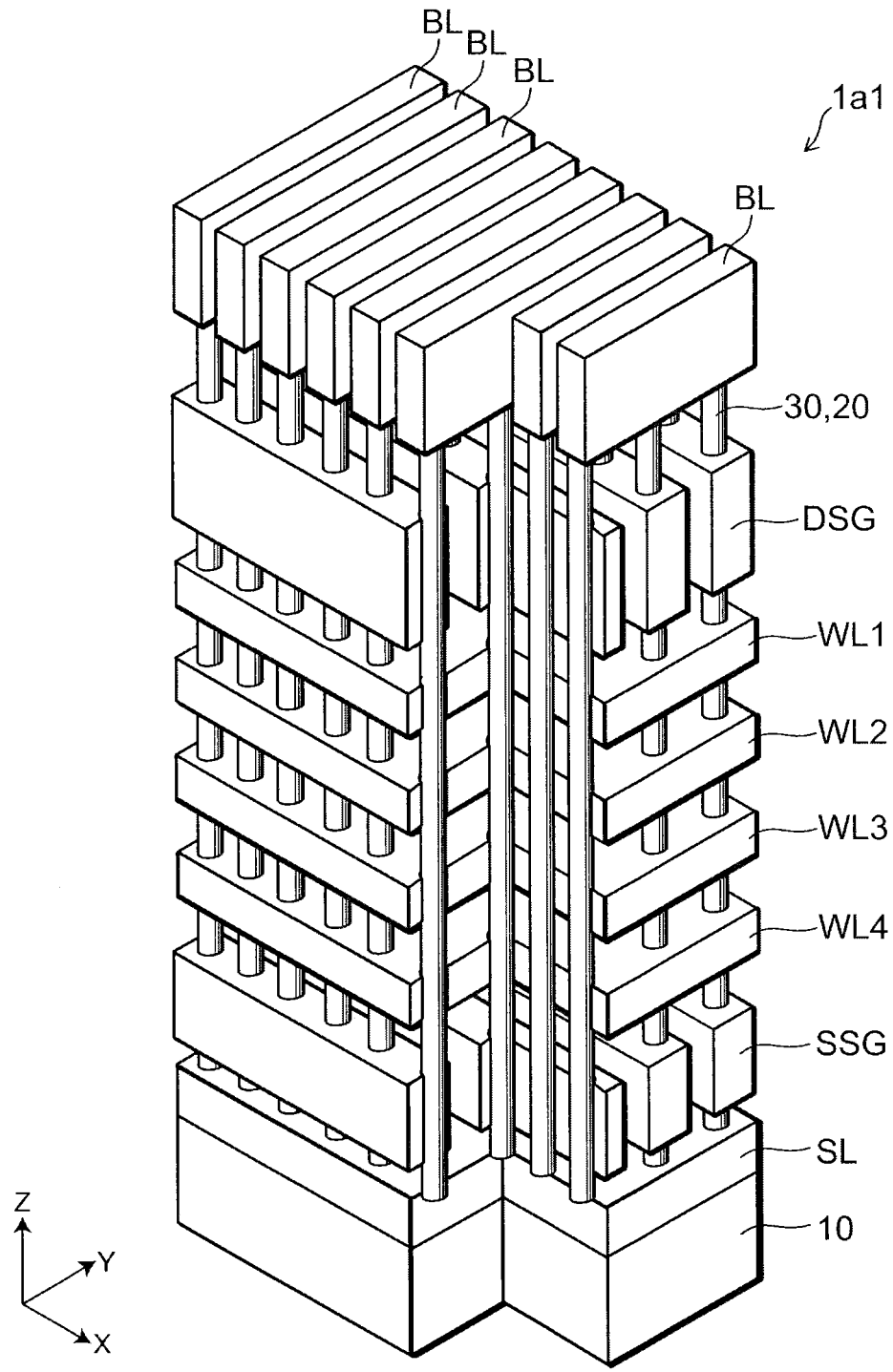
FIG. 14 is a schematic perspective view for illustrating another configuration of an element region 1$a$1 provided in a semiconductor device 1 according to the first embodiment.

FIG. 14 is a schematic perspective view for illustrating another configuration of an element region 1a1 provided in a semiconductor device 1 according to the first embodiment.

In FIG. 14, in order to simplify the drawing, an insulated portion is omitted, but only a conductive portion is illustrated.

In FIG. 1, the U-shaped memory strings are illustrated. In contrast, as shown in FIG. 14, I-shaped memory strings may be used.

In the above configuration, a source line SL is provided on the substrate 10, and a source side selective gate (or lower selective gate) SSG is provided thereabove. Further, the conductive layers WL1 to WL4 are provided thereabove and a drain side selective gate (or upper selective gate) DSG is provided between the uppermost conductive layer WL1 and the bit line BL.

Even in case of the element region 1a1 having the above-mentioned configuration, by providing the supporting unit around the mark, it is possible to suppress the stacked conductive layers from being partially collapsed when the sacrificial layer is removed by the substitution process.

Further, the supporting unit provided around the mark and the forming method thereof are the same as those described above. Therefore, the description thereof will be omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A semiconductor device comprising a stacked body in which a plurality of conductive layers and a plurality of insulating layers are alternately stacked, comprising:

a mark opened onto a surface of the stacked body and that passes through the stacked body in a stacked direction; and a supporting unit that is provided around the mark and that passes through the stacked body in the stacked direction, wherein the supporting unit is in contact with at least a plurality of conductive layers.

2. The device according to claim 1, wherein the supporting unit is provided so as to extend from an upper surface of an uppermost conductive layer to a lower surface of a lowermost conductive layer in the stacked direction.

3. The device according to claim 1, wherein the supporting unit is provided so as to enclose the mark.

4. The device according to claim 3, wherein the supporting unit has a frame shape.

5. The device according to claim 1, wherein a plurality of supporting units are provided around the mark.

6. The device according to claim 5, wherein the plurality of supporting units are disposed so as to enclose the mark.

7. The device according to claim 5, wherein the plurality of supporting units are regularly disposed.

8. The device according to claim 5, wherein the plurality of supporting units have dot shapes.

9. The device according to claim 1, wherein a width dimension of the supporting unit is 100 nm or less.

10. The device according to claim 1, wherein the supporting unit includes a silicon nitride.

11. The device according to claim 1, wherein the mark is a lithographic mark or a mark for inspecting a photo mask.

* * * * *